(12) United States Patent
Moriwaki

(10) Patent No.: US 10,937,913 B2
(45) Date of Patent: Mar. 2, 2021

(54) IMAGING ELEMENT, SOLID STATE IMAGING DEVICE, AND ELECTRONIC DEVICE

(71) Applicant: SONY CORPORATION, Tokyo (JP)

(72) Inventor: Toshiki Moriwaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/343,516

(22) PCT Filed: Oct. 25, 2017

(86) PCT No.: PCT/JP2017/038489
§ 371 (c)(1),
(2) Date: Apr. 19, 2019

(87) PCT Pub. No.: WO2018/084047
PCT Pub. Date: May 11, 2018

(65) Prior Publication Data
US 2019/0245102 A1   Aug. 8, 2019

(30) Foreign Application Priority Data

Nov. 2, 2016 (JP) .............................. JP2016-215162

(51) Int. Cl.
*H01L 33/00* (2010.01)
*H01L 31/0224* (2006.01)
(Continued)

(52) U.S. Cl.
CPC ............... *H01L 31/022475* (2013.01); *H01L 21/02565* (2013.01); *H01L 27/14643* (2013.01);
(Continued)

(58) Field of Classification Search
CPC ... H01L 27/307; H01L 27/146; H01L 51/442; H01L 31/022475; H01L 27/14665;
(Continued)

(56) References Cited

U.S. PATENT DOCUMENTS

2009/0004759 A1   1/2009  Ahn et al.
2011/0253203 A1*  10/2011 Myong ................ H01L 31/075
                                                         136/255
(Continued)

FOREIGN PATENT DOCUMENTS

| JP | 2010-003901 | 1/2010 |
| JP | 2014-220488 | 11/2014 |
| JP | 2015-019073 | 1/2015 |

OTHER PUBLICATIONS

International Search Report and Written Opinion prepared by the European Patent Office dated Jan. 29, 2018, for International Application No. PCT/JP2017/038489.
(Continued)

*Primary Examiner* — Robert G Bachner
(74) *Attorney, Agent, or Firm* — Sheridan Ross P.C.

(57) ABSTRACT

An imaging element includes a first electrode, a second electrode, and a light receiving layer between the first electrode and the second electrode to receive incident light from the second electrode. The second electrode includes an indium-tin oxide layer which includes at least one of silicon or silicon oxide.

20 Claims, 7 Drawing Sheets

(51) Int. Cl.
  *H01L 33/42* (2010.01)
  *H01L 21/02* (2006.01)
  *H01L 27/146* (2006.01)
  *H01L 27/30* (2006.01)

(52) U.S. Cl.
  CPC .................. *H01L 27/14665* (2013.01); *H01L 31/022466* (2013.01); *H01L 33/42* (2013.01); *H01L 27/307* (2013.01)

(58) Field of Classification Search
  CPC ......... H01L 31/0224; H01L 31/022466; H01L 31/10; H01L 51/5253; H01L 27/322; H01L 51/5237; H01L 51/524; H01L 51/5246; H01L 21/02565; H01L 2251/308; H01L 2251/552; H01L 27/14625; H01L 27/14685; H01L 2924/0134; H01L 29/247; H01L 31/035209; H01L 31/095; H01L 33/42; H01L 51/0008; H01L 51/0029; H01L 51/0032; H01L 51/4206; H01L 51/424; H01L 51/4246; H01L 51/4273; H01L 51/441; H01L 21/3205; H01L 23/522; H01L 27/14; H01L 27/1462; H01L 27/14643; H01L 51/001; H01L 51/0072; H01L 51/5215; H01L 2251/303; H01L 2251/305; H01L 27/14603; H01L 27/14609; H01L 27/14636; H01L 27/14638; H01L 27/1464; H01L 27/14647; H01L 31/02161; H01L 31/02366; H01L 31/0376; H01L 33/0045; H01L 33/44; H01L 51/0074; H01L 51/0078; H01L 51/0081; H01L 51/42; H01L 51/448; H01L 51/5234; G09G 3/3208; G09G 2340/0464; G09G 2380/02; G09G 3/22; G09G 2300/0426; G09G 2340/0492; G09G 3/20; G09G 2300/043; G09G 2320/029; G09G 2320/046; G09G 2320/066; G09G 2320/0666; G09G 2360/142; G09G 2360/144; G09G 2360/145; G09G 2360/16; G09G 3/007; B01L 7/52; B01L 2200/147; B01L 2300/0654; B01L 2300/0819; B01L 2300/1827; B01L 2300/1822; B01L 2300/023; B01L 2300/024; B01L 2300/0627; B01L 2300/0829; B01L 2300/0893
  See application file for complete search history.

(56) References Cited

U.S. PATENT DOCUMENTS

| | | | |
|---|---|---|---|
| 2014/0306180 A1* | 10/2014 | Moriwaki | ......... H01L 27/14665 257/14 |
| 2015/0027537 A1* | 1/2015 | Teraji | .............. H01L 31/022466 136/262 |

OTHER PUBLICATIONS

Chopra et al., "Transparent Conductors—A Status Review," Thin Solid Films, vol. 102, No. 1, Apr. 8, 1983, pp. 1-46.
Lee et al., "Structural, electrical, and optical properties of Zn—In—Sn—O films for silicon heterojunction solar cells," Thin Solid Films, vol. 589, Aug. 2015, pp. 233-237.
Minami et al., "Transparent conducting zinc-co-doped ITO films prepared by magnetron sputtering," Thin Solid Films, vol. 373, No. 1-2, Sep. 3, 2000, pp. 189-194.
Oh et al., "Electrical and optical properties of Si-doped indium tin oxides as transparent electrode and anti-reflection coating for solar cells," Current Applied Physics, vol. 15, No. 7, Apr. 22, 2015, pp. 794-798.
Official Action (with English translation) for Japanese Patent Application No. 2016-215162, dated Oct. 20, 2020, 6 pages.

* cited by examiner

[FIG. 1A]
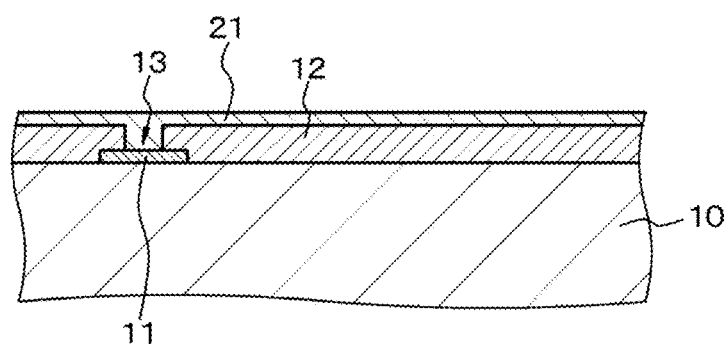
[FIG. 1B]
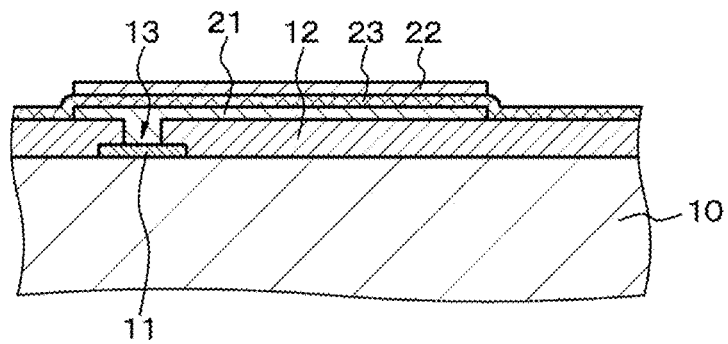

[FIG. 2A]
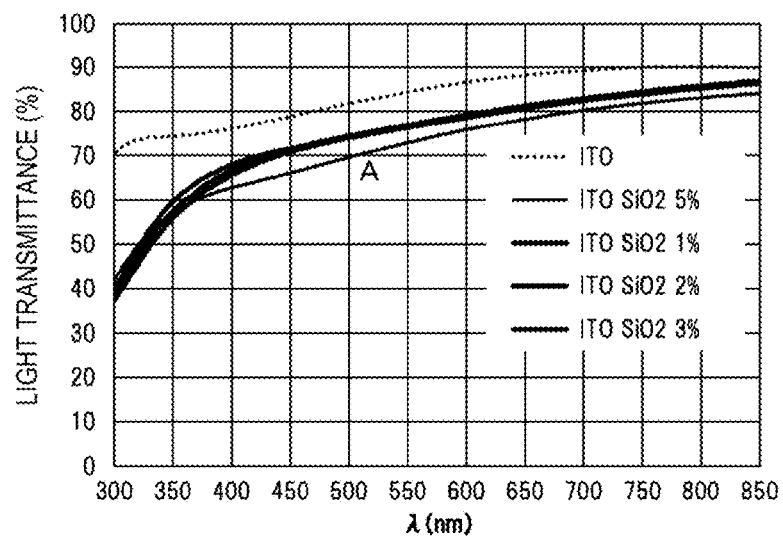
[FIG. 2B]
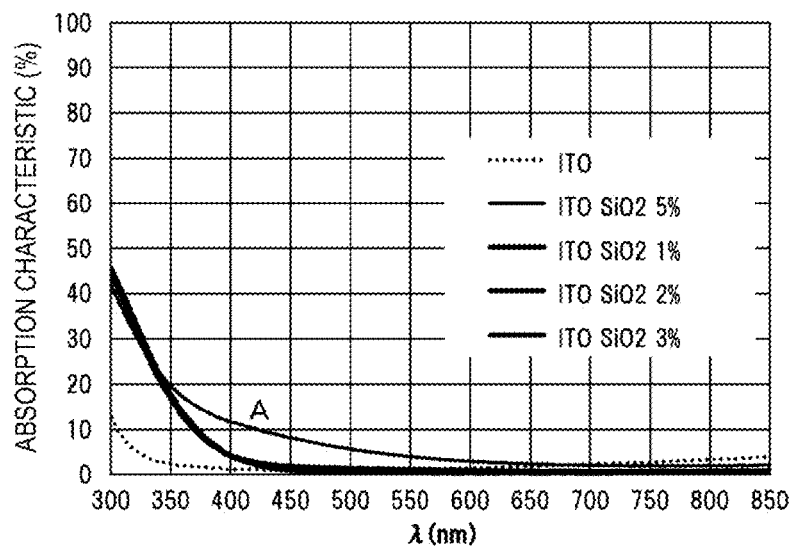

[FIG. 3A]
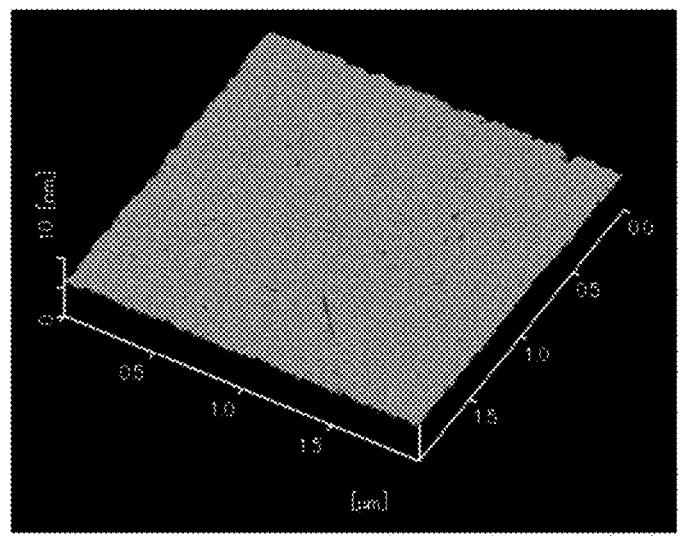
[FIG. 3B]
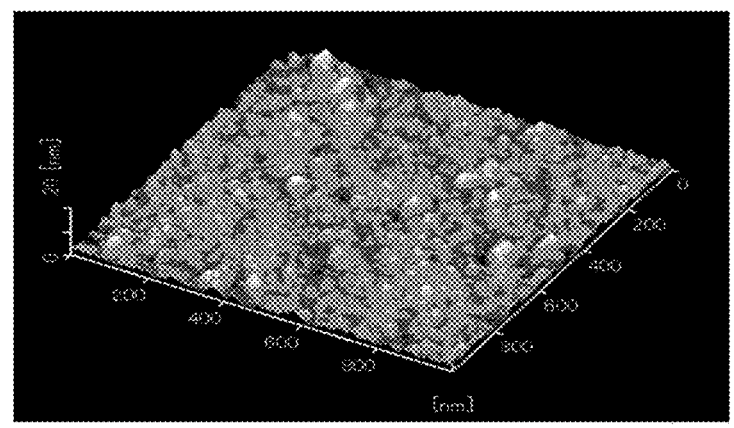

[FIG. 4]
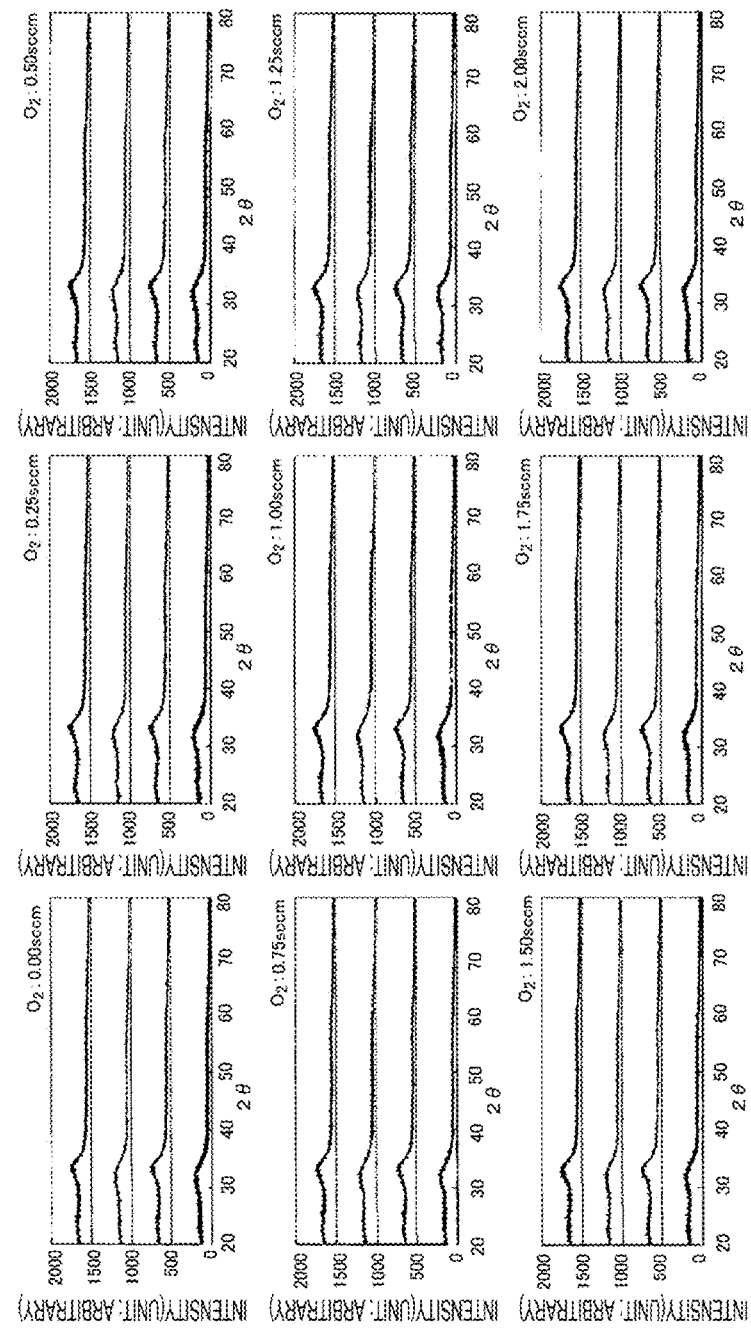

[FIG. 5]
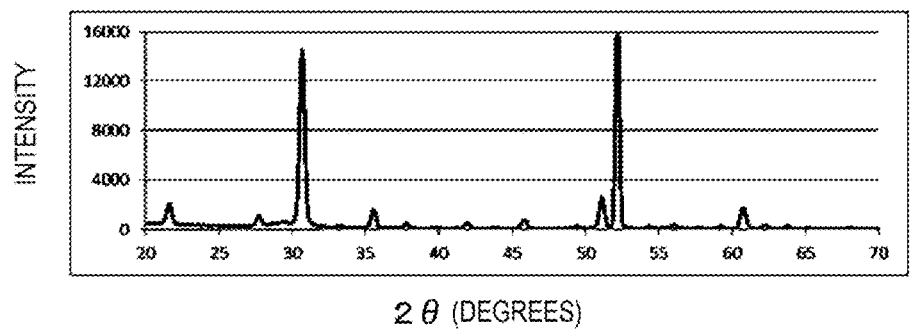

[FIG. 6]
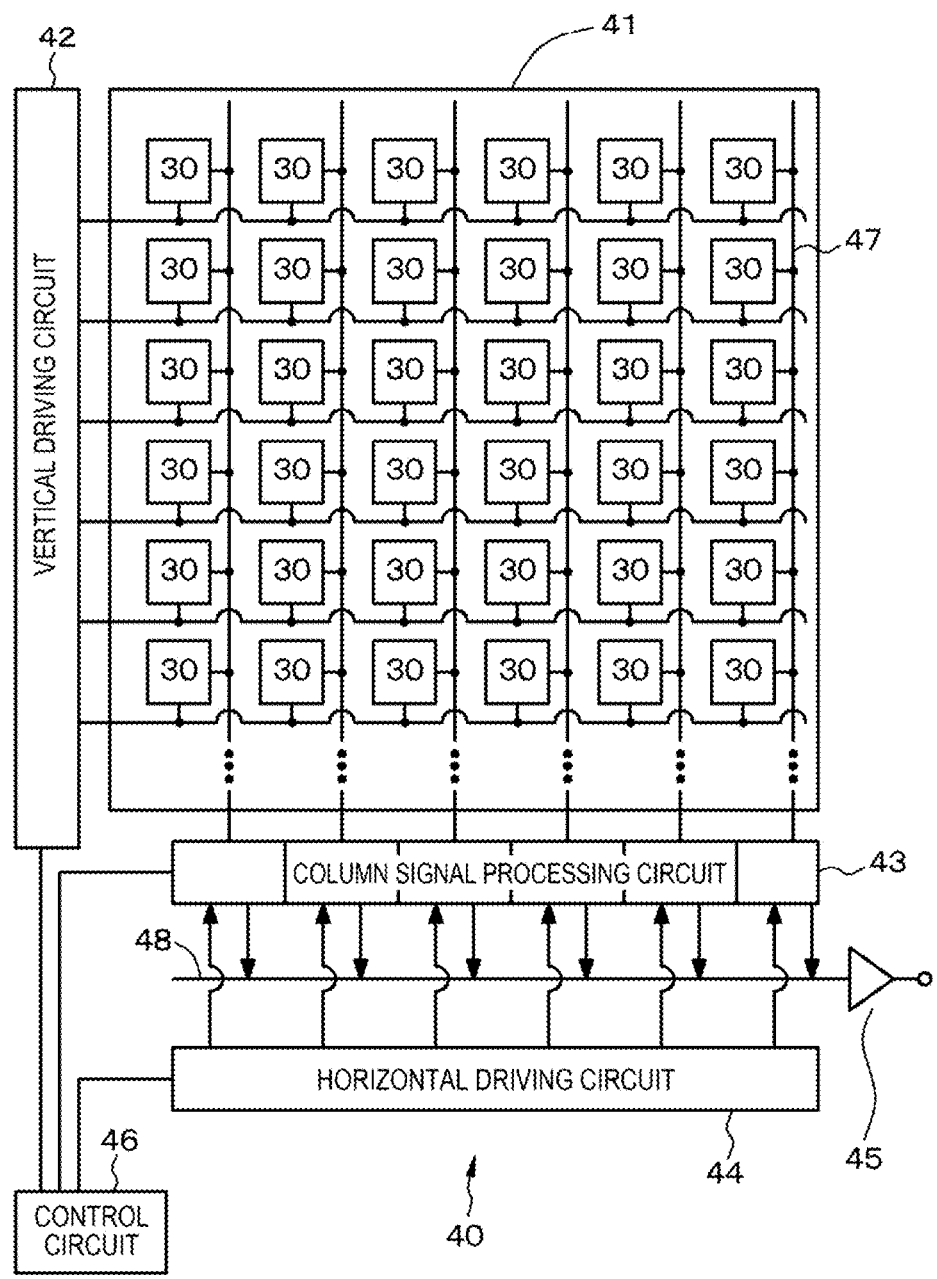

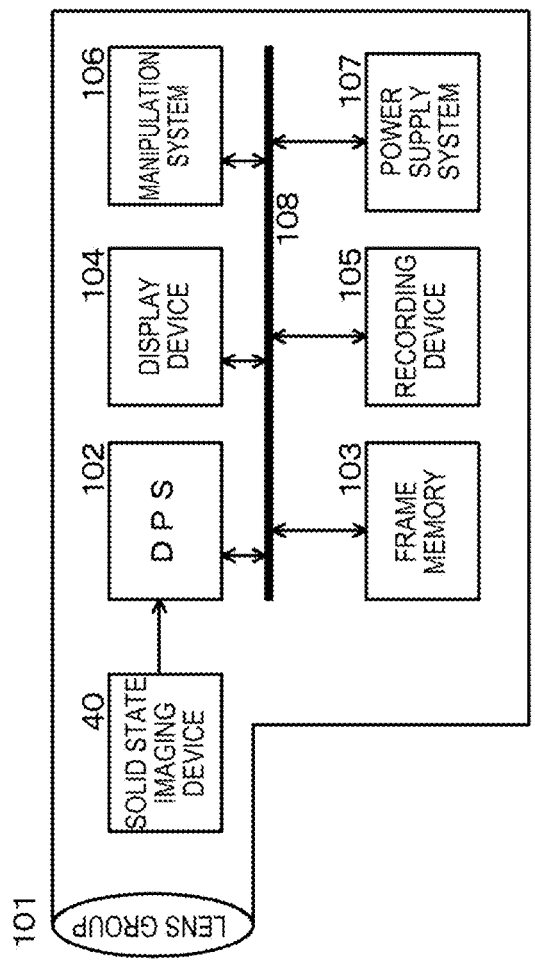
[FIG. 7]

IMAGING ELEMENT, SOLID STATE IMAGING DEVICE, AND ELECTRONIC DEVICE

CROSS REFERENCE TO RELATED APPLICATIONS

This application is a national stage application under 35 U.S.C. 371 and claims the benefit of PCT Application No. PCT/JP2017/038489 having an international filing date of 25 Oct. 2017, which designated the United States, which PCT application claimed the benefit of Japanese Patent Application No. 2016-215162 filed 2 Nov. 2016, the entire disclosures of each of which are incorporated herein by reference.

TECHNICAL FIELD

The present disclosure relates to an imaging element, a solid state imaging device, and an electronic device.

BACKGROUND ART

An imaging element included in an image sensor or the like has a structure in which, for example, a light receiving layer (a photoelectric conversion layer) is sandwiched by two electrodes. In such an imaging element, the transparent electrode on which light is incident is usually formed of a transparent conductive material of an indium-tin oxide (ITO) having crystallinity. However, such a transparent electrode made of an ITO has large internal stress, and often causes a characteristic reduction of the imaging element. An imaging element (photoelectric conversion element) for solving the problem derived from the internal stress of such a transparent electrode is known from, for example, JP 2010-003901A. That is, the imaging element (photoelectric conversion element) disclosed in this Japanese Unexamined Patent Application Publication includes a photoelectric conversion layer placed between a pair of electrodes and at least one stress buffer layer sandwiched by one of the pair of electrodes and the photoelectric conversion layer; in the imaging element, the stress buffer layer has a stacked structure including crystal layers, specifically, a structure in which two crystal layers and two amorphous layers (a total of four layers) are alternately stacked.

CITATION LIST

Patent Literature

PTL 1: JP 2010-003901A

SUMMARY

Technical Problem

However, in the technology disclosed in Japanese Unexamined Patent Application Publication mentioned above, the stress buffer layer has an at least four-layer configuration and the structure is complicated; therefore, there is a problem that the formation process is complicated and the formation of the stress buffer layer takes a long time.

Thus, it is desirable to provide an imaging element having a configuration and a structure that do not cause a characteristic reduction in spite of a simple structure, a solid state imaging device including the imaging element, and an electronic device.

Solution to Problem

An imaging element according to a first embodiment of the present disclosure includes: a stacked structure body composed of a first electrode, a light receiving layer formed on the first electrode, and a second electrode formed on the light receiving layer, and configured such that light is incident from the second electrode. The second electrode is made of an amorphous oxide made of an indium-tin oxide in which at least one material selected from the group consisting of silicon and a silicon oxide is mixed or doped.

An imaging element according to a second embodiment of the present disclosure includes: a stacked structure body composed of a first electrode, a light receiving layer formed on the first electrode, and a second electrode formed on the light receiving layer, and configured such that light is incident from the second electrode. The second electrode is made of an amorphous oxide made of an indium-tin oxide in which at least one material selected from the group consisting of cobalt, a cobalt oxide, tungsten, a tungsten oxide, zinc, and a zinc oxide is mixed or doped.

A solid state imaging device according to the first embodiment of the present disclosure includes a plurality of imaging elements. Each of the imaging elements includes a stacked structure body composed of a first electrode, a light receiving layer formed on the first electrode, and a second electrode formed on the light receiving layer, and configured such that light is incident from the second electrode, and the second electrode is made of an amorphous oxide made of an indium-tin oxide in which at least one material selected from the group consisting of silicon and a silicon oxide is mixed or doped.

A solid state imaging device according to the second embodiment of the present disclosure includes a plurality of imaging elements. Each of the imaging elements includes a stacked structure body composed of a first electrode, a light receiving layer formed on the first electrode, and a second electrode formed on the light receiving layer, and configured such that light is incident from the second electrode, and the second electrode is made of an amorphous oxide made of an indium-tin oxide in which at least one material selected from the group consisting of cobalt, a cobalt oxide, tungsten, a tungsten oxide, zinc, and a zinc oxide is mixed or doped.

An electronic device according to the first embodiment of the present disclosure includes: a stacked structure body composed of a first electrode, a light emitting/light receiving layer formed on the first electrode, and a second electrode formed on the light emitting/light receiving layer, and configured such that light is incident from the second electrode. The second electrode is made of an amorphous oxide made of an indium-tin oxide in which at least one material selected from the group consisting of silicon and a silicon oxide is mixed or doped.

An electronic device according to the second embodiment of the present disclosure includes: a stacked structure body composed of a first electrode, a light emitting/light receiving layer formed on the first electrode, and a second electrode formed on the light emitting/light receiving layer, and configured such that light is incident from the second electrode. The second electrode is made of an amorphous oxide made of an indium-tin oxide in which at least one material selected from the group consisting of cobalt, a cobalt oxide, tungsten, a tungsten oxide, zinc, and a zinc oxide is mixed or doped.

Advantageous Effects of Invention

In the imaging element, the solid state imaging device, or the electronic device according to the first embodiment or the second embodiment of the present disclosure, since the second electrode is not configured from an ITO but is configured from an amorphous oxide in which the constituent materials are prescribed, the internal stress in the second electrode is reduced; thus, an imaging element, an electronic device, and a solid state imaging device having high reliability in which, in spite of a simple configuration and a simple structure, there is no fear that a characteristic reduction of the imaging element, the electronic device, or the solid state imaging device will be caused can be provided. Further, since the second electrode is configured from an amorphous oxide, the entry of water can be prevented (or alternatively, reduced), and an imaging element, an electronic device, and a solid state imaging device having high reliability can be provided. The effects described in this specification are only examples and are not limitative ones, and there may be additional effects.

BRIEF DESCRIPTION OF DRAWINGS

FIG. 1A is a schematic partial cross-sectional view of a substrate etc. for describing a method for manufacturing an imaging element etc. of Example 1.

FIG. 1B is a schematic partial cross-sectional view of a substrate etc. for describing a method for manufacturing an imaging element etc. of Example 1.

FIG. 2A is a graph showing the relationship between the wavelength of incident light and the light transmittance in imaging elements etc. of Example 1 in which the second electrode is configured from ITO-$SiO_X$-based materials and an imaging element of Comparative Example 1 in which the second electrode is configured from an ITO and an IZO.

FIG. 2B is a graph showing the relationship between the wavelength of incident light and the absorption characteristic in imaging elements etc. of Example 1 in which the second electrode is configured from ITO-$SiO_X$-based materials and an imaging element of Comparative Example 1 in which the second electrode is configured from an ITO and an IZO.

FIG. 3A is a surface SEM image of the second electrode in Example 1A (provided that it is a product of annealing treatment at 250° C. for 1 hour in a nitrogen atmosphere).

FIG. 3B is a surface SEM image of the second electrode in Comparative Example 1 (provided that it is a product of annealing treatment at 250° C. for 1 hour in a nitrogen atmosphere).

FIG. 4 is charts showing the X-ray diffraction analysis results of the second electrodes in Example 1.

FIG. 5 is a chart showing the X-ray diffraction analysis result of the second electrode in Comparative Example 1.

FIG. 6 is a conceptual diagram of a solid state imaging device of Example 2.

FIG. 7 is a diagram showing the configuration of the solid state imaging device of Example 2.

DESCRIPTION OF EMBODIMENTS

Hereinbelow, embodiments of the present disclosure are described based on Examples with reference to the drawings; but the present disclosure is not limited to Examples, and the various numerical values and materials in Examples are only examples.

1. Overall description of imaging element, solid state imaging device, and electronic device according to first embodiment and second embodiment of present disclosure 2. Example 1 (imaging element and electronic device according to first embodiment and second embodiment of present disclosure)

3. Example 2 (solid state imaging device according to first embodiment and second embodiment of present disclosure)

4. Other items

<Overall Description of Imaging Element, Solid State Imaging Device, and Electronic Device According to First Embodiment and Second Embodiment of Present Disclosure>

The imaging element according to the first embodiment of the present disclosure, the imaging element in the solid state imaging device according to the first embodiment of the present disclosure, and the electronic device according to the first embodiment of the present disclosure may be hereinafter collectively referred to as "the imaging element etc. according to the first embodiment of the present disclosure," and the imaging element according to the second embodiment of the present disclosure, the imaging element in the solid state imaging device according to the second embodiment of the present disclosure, and the electronic device according to the second embodiment of the present disclosure may be hereinafter collectively referred to as "the imaging element etc. according to the second embodiment of the present disclosure." Further, the imaging element etc. according to the first embodiment of the present disclosure and the imaging element etc. according to the second embodiment of the present disclosure may be collectively referred to as simply "the imaging element etc. of an embodiment of the present disclosure."

In the imaging element etc. of an embodiment of the present disclosure, the second electrode desirably has an absorption characteristic (an ultraviolet absorption characteristic) of 20% or more and preferably 35% or more at a wavelength of 300 nm, and furthermore desirably has an absorption characteristic of 15% or more and preferably 20% or more at a wavelength of 350 nm. By the second electrode having such absorption characteristics, the second electrode absorbs ultraviolet light incident on the second electrode; consequently, the arrival of ultraviolet light at the light receiving layer or the light emitting/light receiving layer (hereinafter, these are collectively referred to as "the light emitting layer etc.") can be suppressed. Then, as a result, the increase in dark current in the imaging element and the electronic device, the occurrence of in-plane unevenness of dark current in the solid state imaging device, and the worsening of afterimage characteristics can be suppressed. In addition, such ultraviolet light is used in the patterning process of the second electrode, alternatively used at the time of forming various films and layers in the chemical vapor deposition method (the CVD method), or alternatively used at the time of forming on-chip microlenses, for example.

In the imaging element etc. of an embodiment of the present disclosure including the preferred forms mentioned above, the thickness of the second electrode is $1 \times 10^{-8}$ m to $1.5 \times 10^{-7}$ m, preferably $2 \times 10^{-8}$ m to $1 \times 10^{-7}$ m, and more preferably $3 \times 10^{-8}$ m to $5 \times 10^{-8}$ m. By thus prescribing the thickness of the second electrode, light (light other than ultraviolet light) can be caused to reach the light receiving layer etc. via the second electrode still more reliably, and furthermore the second electrode can exhibit a function as an electrode reliably.

In the imaging element etc. of an embodiment of the present disclosure including the preferred forms described above, a form in which the material mentioned above is mixed or doped at 5 mass % or less and preferably 1 mass % or more and 3 mass % or less in the second electrode is possible.

Alternatively, in the imaging element etc. of an embodiment of the present disclosure, in a case where the second electrode is configured from an indium-tin oxide in which silicon is mixed or doped (an ITO-Si-based material), in a case where the second electrode is configured from an indium-tin oxide in which a silicon oxide is mixed or doped (an ITO-SiO$_X$-based material), or in a case where the second electrode is configured from an indium-tin oxide in which silicon and a silicon oxide are mixed or doped (an ITO-Si—SiO$_X$-based material), the ratio of silicon atoms is preferably 1 atomic % to 5 atomic % on the assumption that the total amount of indium atoms, tin atoms, and silicon atoms is 100 atomic %. In a case where the second electrode is configured from an indium-tin oxide in which cobalt is mixed or doped (an ITO-Co-based material), in a case where the second electrode is configured from an indium-tin oxide in which a cobalt oxide is mixed or doped (an ITO-CoO$_X$-based material), or in a case where the second electrode is configured from an indium-tin oxide in which cobalt and a cobalt oxide are mixed or doped (an ITO-Co—CoO$_X$-based material), the ratio of cobalt atoms is preferably 10 atomic % to 20 atomic % on the assumption that the total amount of indium atoms, tin atoms, and cobalt atoms is 100 atomic %. In a case where the second electrode is configured from an indium-tin oxide in which tungsten is mixed or doped (an ITO-W-based material), in a case where the second electrode is configured from an indium-tin oxide in which a tungsten oxide is mixed or doped (an ITO-WO$_X$-based material), or in a case where the second electrode is configured from an indium-tin oxide in which tungsten and a tungsten oxide are mixed or doped (an ITO-W—WO$_X$-based material), the ratio of tungsten atoms is preferably 5 atomic % to 20 atomic % on the assumption that the total amount of indium atoms, tin atoms, and tungsten atoms is 100 atomic %. In a case where the second electrode is configured from an indium-tin oxide in which zinc is mixed or doped (an ITO-Zn-based material), in a case where the second electrode is configured from an indium-tin oxide in which a zinc oxide is mixed or doped (an ITO-ZnO$_X$-based material), or in a case where the second electrode is configured from an indium-tin oxide in which zinc and a zinc oxide are mixed or doped (an ITO-Zn—ZnO$_X$-based material), the ratio of zinc atoms is preferably 5 atomic % to 20 atomic % on the assumption that the total amount of indium atoms, tin atoms, and zinc atoms is 100 atomic %. However, the ratios are not limited to these values. Further, the various materials described above are transparent conductive materials.

Further, in the imaging element etc. of an embodiment of the present disclosure including the preferred forms described above, the surface roughness Ra of the second electrode is 0.5 nm or less and preferably 0.3 nm or less, and the surface roughness Rq of the second electrode is 0.5 nm or less and preferably 0.3 nm or less. The surface roughnesses Ra and Rq are based on the provision of JIS B06 01-2013. The smoothness of the second electrode like this can suppress the surface scattering reflection at the second electrode, can reduce the surface reflection of light incident on the second electrode, can suppress the loss of the amount of light incident on the light receiving layer etc. via the second electrode, and can achieve an improvement in light current characteristics in photoelectric conversion.

Further, in the imaging element etc. of an embodiment of the present disclosure including the preferred forms described above, the light transmittance of the second electrode for light of wavelengths of 400 nm to 660 nm is preferably 65% or more. Further, also the light transmittance of the first electrode for light of wavelengths of 400 nm to 660 nm is preferably 65% or more.

Further, in the imaging element etc. according to the embodiment of the present disclosure including the preferred forms described above, it is preferable that the electric resistance value of the second electrode be $1 \times 10^{-6}$ Ω·cm or less. Alternatively, it is preferable that the sheet resistance value of the second electrode be $3 \times 10 Ω/\square$ to $1 \times 10^3 Ω/\square$.

Further, in the imaging element etc. of an embodiment of the present disclosure including the preferred forms described above, the first electrode is preferably made of an amorphous oxide made of an indium-tin oxide in which at least one material selected from the group consisting of silicon, a silicon oxide, cobalt, a cobalt oxide, tungsten, a tungsten oxide, zinc, and a zinc oxide is mixed or doped. Alternatively, the first electrode may be a form configured from a transparent conductive material such as an indium-tin oxide (ITO), an indium-SiO$_X$ oxide (IZO), or tin oxide (SnO$_2$). As the method for forming the first electrode, depending on the material that forms the first electrode, PVD methods such as the vacuum deposition method, the reactive deposition method, various sputtering methods, the electron beam evaporation method, and the ion plating method, various CVD methods such as the pyrosol method, a method of pyrolyzing an organometallic compound, the spraying method, the dipping method, and the MOCVD method, the electroless plating method, and the electrolytic plating method may be given.

In the imaging element etc. according to the embodiment of the present disclosure including the various preferred forms described above, the stacked structure body is preferably in a form having an internal stress of compressive stress of 10 MPa to 50 MPa; thereby, during the formation of the second electrode, the occurrence of stress damage in the light receiving layer etc. can be suppressed still more reliably.

In the imaging element etc. of an embodiment of the present disclosure including the various preferred forms described above, a form in which, when the value of the dark current flowing between the first electrode and the second electrode when 0 volts is applied between the first electrode and the second electrode is denoted by $J_{d-0}$ (amperes) and the value of the dark current flowing between the first electrode and the second electrode when 5 volts is applied between the first electrode and the second electrode is denoted by $J_{d-5}$ (amperes), $J_{d-5}/J_{d-0} \leq 1.2$ is satisfied is possible. Further, when the value of the dark current flowing between the first electrode and the second electrode when a voltage more than 0 volts and 5 volts or less is applied between the first electrode and the second electrode is denoted by $J_d$ (amperes), $J_d/J_{d-0} \leq 1.2$ is satisfied. Here, the dark current can be found by measuring the current flowing between the first electrode and the second electrode when a reverse bias voltage is applied between the first electrode and the second electrode in a state where light is not applied, specifically, in a state of a dark place.

By the electronic device according to the first embodiment or the second embodiment of the present disclosure, a light sensor or an image sensor can be formed. In this case, the light emitting/light receiving layer may be formed of, for example, an organic photoelectric conversion material.

In the imaging element etc. of an embodiment of the present disclosure, the reception or the emission/reception of light (more widely, electromagnetic waves, including visible light, ultraviolet light, and infrared light) in the light receiving layer etc. is performed via the second electrode.

In the electronic device of an embodiment of the present disclosure including the various preferred forms and configurations described above, specifically for example, a configuration in which the first electrode is formed on a substrate, the light receiving layer etc. is formed on the first electrode, and the second electrode is formed on the light receiving layer etc. is possible. That is, the electronic device of an embodiment of the present disclosure has a two-terminal electronic device structure including the first electrode and the second electrode. However, the configuration is not limited to this, and a three-terminal electronic device structure further including a control electrode is possible, and thereby the current flowing can be modulated by applying a voltage to the control electrode. As the three-terminal electronic device structure, specifically, the same configuration and structure as a field effect transistor (FET) of what is called a bottom gate/bottom contact type, a bottom gate/top contact type, a top gate/bottom contact type, or a top gate/top contact type may be given. The second electrode may be made to function as a cathode electrode (negative electrode) (that is, made to function as an electrode for extracting electrons), and on the other hand the first electrode may be made to function as an anode electrode (positive electrode) (that is, made to function as an electrode for extracting holes). Also a structure in which a plurality of imaging elements or electronic devices including light receiving layers etc. having different light absorption spectra are stacked may be employed. Further, for example, a structure in which the substrate is formed of a silicon semiconductor substrate, a driving circuit, a light receiving layer, etc. of the imaging element or the electronic device are provided in the silicon semiconductor substrate, and imaging elements or electronic devices according to the first embodiment or the second embodiment of the present disclosure are stacked on the silicon semiconductor substrate may be employed.

The light receiving layer etc. may be in an amorphous state or a crystalline state. As the organic material that forms the light receiving layer etc. (organic photoelectric conversion material), an organic semiconductor material, an organometallic compound, and organic semiconductor fine particles may be given; or as the material that forms the light receiving layer etc., also a metal oxide semiconductor, inorganic semiconductor fine particles, a material in which a core member is coated with a shell member, and an organic-inorganic hybrid compound may be given.

Here, as the organic semiconductor material, specifically, an organic coloring agent typified by quinacridone and a derivative thereof, a coloring agent in which an ion of the earlier period (referring to the metals on the left side of the periodic table) is chelated with an organic material, typified by Alq3 (tris(8-quinolinolato)aluminum (III)), an organometallic dye complexed by a transition metal ion and an organic material, typified by zinc (II) phthalocyanine, dinaphthothienothiophene (DNTT), and the like may be given.

As the organometallic compound, specifically, the coloring agent in which an ion of the earlier period is chelated with an organic material and the organometallic dye complexed by a transition metal ion and an organic material described above may be given. As the organic semiconductor fine particles, specifically, associated bodies of the organic coloring agent typified by quinacridone and a derivative thereof described above, associated bodies of a coloring agent in which an ion of the earlier period is chelated with an organic material, associated bodies of an organometallic dye complexed by a transition metal ion and an organic material, or Prussian blue, in which metal ions are cross-linked by a cyano group, and a derivative thereof, or composite associated bodies of these may be given.

As the metal oxide semiconductor or the inorganic semiconductor fine particles, specifically, ITO, IGZO, ZnO, IZO, $IrO_2$, $TiO_2$, $SnO_2$, $SiO_X$, a metal chalcogenide semiconductor containing a chalcogen (e.g. sulfur (S), selenium (Se), or tellurium (Te)) (specifically, CdS, CdSe, ZnS, CdSe/CdS, CdSe/ZnS, or PbSe), ZnO, CdTe, GaAs, and Si may be given.

As the combination of the material in which a core member is coated with a shell member, that is, (core member, shell member), specifically, an organic material such as (polystyrene, polyaniline) and a metal material such as (a hardly ionizable metal material, an easily ionizable metal material) may be given. As the organic-inorganic hybrid compound, specifically, Prussian blue, in which metal ions are cross-linked by a cyano group, and a derivative thereof may be given, and in addition a coordination polymer, which is a general term of materials in which metal ions are infinitely crosslinked by a bipyridine and materials in which metal ions are cross-linked by a polyvalent ionic acid typified by oxalic acid and rubeanic acid, may be given.

As the method for forming the light receiving layer etc., depending on the material used, the application method, the physical vapor deposition method (the PVD method), and various chemical vapor deposition methods (CVD methods) including the MOCVD method may be given. Here, as the application method, specifically, the spin coating method; the immersion method; the casting method; various printing methods such as the screen printing method, the inkjet printing method, the offset printing method, and the gravure printing method; the stamping method; the spraying method; and various coating methods such as the air doctor coating method, the blade coating method, the rod coating method, the knife coating method, the squeeze coating method, the reverse roll coating method, the transfer roll coating method, the gravure coating method, the kiss coating method, the cast coating method, the spray coating method, the slit orifice coating method, and the calender coating method may be illustrated. In the application method, as the solvent, a non-polar or low-polar organic solvent such as toluene, chloroform, hexane, or ethanol may be illustrated. As the PVD method, various vacuum deposition methods such as the electron beam heating method, the resistance heating method, and flash evaporation; the plasma deposition method; various sputtering methods such as the dipole sputtering method, the direct current sputtering method, the direct current magnetron sputtering method, the radio-frequency sputtering method, the magnetron sputtering method, the ion beam sputtering method, and the bias sputtering method; and various ion plating methods such as the DC (direct current) method, the RF method, the multi-cathode method, the activated reaction method, the electric field deposition method, the radio-frequency ion plating method, and the reactive ion plating method may be given.

The thickness of the light receiving layer etc. is not limited, and $1\times10^{-10}$ m to $5\times10^{-7}$ m may be illustrated, for example.

As the substrate, an organic polymer such as polymethyl methacrylate (PMMA), polyvinyl alcohol (PVA), a polyvinyl phenol (PVP), a poly(ether sulfone) (PES), a polyimide, a polycarbonate (PC), polyethylene terephthalate (PET), and polyethylene naphthalate (PEN) (having a form of a polymer material such as a plastic film, a plastic sheet, or a plastic substrate formed of a polymer material and having flexibility) may be given. When a substrate formed of such a polymer material having flexibility is used, the electronic device can be incorporated into or integrated with an electronic apparatus having, for example, a curved surface shape. Alternatively, as the substrate, various glass substrates, various glass substrates with an insulating film formed on their surface, a quartz substrate, a quartz substrate with an insulating film formed on its surface, a silicon semiconductor substrate, a silicon semiconductor substrate with an insulating film formed on its surface, and metal substrates made of various alloys and/or various metals such as stainless steel may be given. As the insulating film, a silicon oxide-based material (e.g. $SiO_X$ or spin-on glass (SOG)); silicon nitride ($SiN_Y$); silicon oxynitride (SiON); aluminum oxide ($Al_2O_3$); and a metal oxide and a metal salt may be given. Also an electrically conductive substrate (a substrate made of a metal such as gold or aluminum or a substrate made of highly oriented graphite) with any of these insulating films formed on its surface may be used. The surface of the substrate is preferably smooth, but may have a roughness that does not adversely influence the characteristics of the light receiving layer etc. The adhesion between the first electrode and the substrate may be improved by forming a silanol derivative formed by the silane coupling method, forming a thin film made of a thiol derivative, a carboxylic acid derivative, a phosphoric acid derivative, or the like formed by the SAM method or the like, or forming a thin film made of an insulating metal salt or metal complex formed by the CVD method or the like, on the surface of the substrate.

The second electrode or the first electrode may be coated with a coating layer depending on the circumstances. As the material that forms the coating layer, a silicon oxide-based material; silicon nitride ($SiN_Y$); and an inorganic-based insulating material such as a metal oxide high dielectric insulating film of aluminum oxide ($Al_2O_3$) or the like may be given; further, polymethyl methacrylate (PMMA); a polyvinyl phenol (PVP); polyvinyl alcohol (PVA); a polyimide; a polycarbonate (PC); polyethylene terephthalate (PET); polystyrene; a silanol derivative (a silane coupling agent) such as N-(2-aminoethyl)-3-aminopropyltrimethoxysilane (AEAPTMS), 3-mercaptopropyltrimethoxysilane (MPTMS), and octadecyltrichlorosilane (OTS); and an organic-based insulating material (an organic polymer) such as a linear hydrocarbon having a functional group capable of binding to the control electrode at one end, such as octadecanethiol and dodecyl isocyanate, may be given; and further, combinations of these may be used. As the silicon oxide-based material, silicon oxide ($SiO_X$), BPSG, PSG, BSG, AsSG, PbSG, silicon oxynitride (SiON), and SOG (spin-on glass) may be illustrated; further, a low-permittivity material (e.g. a poly(aryl ether), a cycloperfluorocarbon polymer, benzocyclobutene, a cyclic fluorine resin, polytetrafluoroethylene, an aryl ether fluoride, a polyimide fluoride, amorphous carbon, and an organic SOG) may be used. As the method for forming the insulating layer, any of the various PVD methods described above; various CVD methods; the spin coating method; the various application methods described above; the sol-gel method; the electrodeposition method; the shadow mask method; and the spraying method may be given.

Example 1

Example 1 relates to the imaging element and the electronic device according to the first embodiment and the second embodiment of the present disclosure. A schematic partial cross-sectional view of an imaging element or an electronic device of Example 1 is shown in FIG. 1B.

The imaging element or the electronic device of Example 1 (hereinafter, referred to as "the imaging element etc. of Example 1") includes a stacked structure body that is composed of a first electrode 21, a light receiving layer or a light emitting/light receiving layer 23 formed on the first electrode 21 (hereinafter, referred to as "the light receiving layer etc. 23"), and a second electrode 22 formed on the light receiving layer etc. 23 and on which light is incident from the second electrode 22. Here, it should be understood that layer 23 may be a light receiving layer 23 (e.g., of an imaging device), or alternatively, layer 23 may be a light emitting layer 23 that includes a light source such as a light-emitting diode (LED). Here, the second electrode 22 is made of an amorphous oxide (transparent conductive material) made of an indium-tin oxide in which at least one material selected from the group consisting of silicon and a silicon oxide is mixed or doped. Alternatively, the second electrode 22 is made of an amorphous oxide (transparent conductive material) made of an indium-tin oxide in which at least one material selected from the group consisting of cobalt, a cobalt oxide, tungsten, a tungsten oxide, zinc, and a zinc oxide is mixed or doped. For example, at least one of the cobalt, the cobalt oxide, the tungsten, the tungsten oxide, the zinc, or the zinc oxide is mixed or doped at 5 mass % or less in the second electrode. In Example 1, specifically, the second electrode 22 is made of an amorphous oxide made of an indium-tin oxide in which a silicon oxide is mixed or doped (an ITO-$SiO_X$-based material).

Then, the second electrode 22 has an absorption characteristic (an ultraviolet absorption characteristic) of 20% or more and preferably 35% or more at a wavelength of 300 nm, and further has an absorption characteristic of 15% or more and preferably 20% or more at a wavelength of 350 nm. Further, the thickness of the second electrode 22 is $1 \times 10^{-8}$ m to $1.5 \times 10^{-7}$ m, preferably $2 \times 10^{-8}$ m to $1 \times 10^{-7}$ m, and more preferably $3 \times 10^{-8}$ m to $5 \times 10^{-8}$ m; specifically, it is set to 0.05 μm in Example 1.

Here, in the imaging element etc. of Example 1, more specifically, the first electrode 21 is formed on a substrate 10 formed of a silicon semiconductor substrate, the light receiving layer etc. 23 is formed on the first electrode 21, and the second electrode 22 is formed on the light receiving layer etc. 23. That is, the electronic device of Example 1 has a two-terminal electronic device structure including the first electrode 21 and the second electrode 22. In the light receiving layer etc. 23, specifically, photoelectric conversion is performed. The second electrode 22 functions as a cathode electrode (negative electrode). That is, the second electrode 22 functions as an electrode for extracting electrons. On the other hand, the first electrode 21 functions as an anode electrode (positive electrode). That is, the first electrode 21 functions as an electrode for extracting holes. The light receiving layer etc. 23 is made of an organic photoelectric conversion material, specifically for example, quinacridone with a thickness of 0.1 μm. The first electrode 21 and the second electrode 22 are patterned in a desired configuration. The first electrode 21 may not be patterned depending on the circumstances, and the second electrode 22 may not be patterned.

In the imaging element etc. of Example 1, the light transmittance of the second electrode 22 for light of wavelengths of 400 nm to 660 nm is 65% or more, and also the light transmittance of the first electrode 21 for light of wavelengths of 400 nm to 660 nm is 65% or more. The light transmittance of the second electrode 22 or the first electrode 21 can be measured by forming a film of the second electrode 22 or the first electrode 21 on a transparent glass plate. The electric resistance value of the second electrode 22 is $1\times10^{-6}$ Ω·cm or less, and the sheet resistance value of the second electrode 22 is $3\times10Ω/\square$ to $1\times10^3Ω/\square$. The surface roughness Ra of the second electrode 22 is 0.5 nm or less, preferably 0.3 nm or less, and the surface roughness Rq of the second electrode 22 is 0.5 nm or less, preferably 0.3 nm or less.

A method for manufacturing the imaging element etc. of Example 1 will now be described with reference to FIG. 1A and FIG. 1B.

<Process-100>

A substrate 10 formed of a silicon semiconductor substrate is prepared. Here, in the substrate 10, for example, a driving circuit, a light receiving layer, etc. (these not illustrated) of the imaging element or the electronic device and an interconnection 11 are provided, and an insulating layer 12 is formed on the surface. In the insulating layer 12, an opening 13 at the bottom of which the interconnection 11 is exposed is provided. On the insulating layer 12 including the interior of the opening 13, a first electrode 21 made of an ITO is formed (as a film) based on the sputtering method (see FIG. 1A).

<Process-110>

Subsequently, the patterning of the first electrode 21 is performed, then a light receiving layer etc. 23 made of quinacridone is formed (as a film) on the entire surface by the vacuum deposition method, further a second electrode 22 made of an indium-tin oxide in which a silicon oxide ($SiO_X$) is mixed or doped (an ITO-$SiO_X$-based material) is formed (as a film) on the light receiving layer etc. 23 based on the sputtering method at room temperature (specifically, 22° C. to 28° C.), and then the second electrode 22 is patterned based on photolithography technology and etching technology; thereby, a second electrode 22 patterned in a desired configuration can be obtained. Thus, the electronic device of Example 1 having the structure shown in FIG. 1B can be obtained. A parallel plate sputtering apparatus or a DC magnetron sputtering apparatus is used as the sputtering apparatus, argon (Ar) gas is used as the process gas, and an ITO-$SiO_X$-based material (assuming that the total mass of the indium-tin oxide and $SiO_X$ is 100%) is used as the target. Although in the photolithography technology ultraviolet light is used for the patterning of the resist material for etching, the ultraviolet light is absorbed in the second electrode 22, and the arrival of ultraviolet light at the light receiving layer etc. 23 can be suppressed. A passivation film or the like is further formed as a film on the entire surface as necessary, and patterning is performed as necessary. Although also in these processes ultraviolet light is often used, the ultraviolet light is absorbed in the second electrode 22 and is less likely to reach the light receiving layer etc. 23. On-chip microlenses are formed as necessary; also the ultraviolet light used at this time is absorbed in the second electrode 22 and is less likely to reach the light receiving layer etc. 23.

The film thickness of the second electrode 22 was set to 0.05 μm. Further, after the film formation, annealing treatment at 150° C. for 150 minutes was performed. The relationships between the $SiO_X$ concentration "X" (mass %), the wavelength of incident light (X), the light transmittance (T), and the absorption characteristic (a) in cases where the second electrode 22 is configured from amorphous oxides made of ITO-$SiO_X$-based materials (assuming that the total mass of the indium-tin oxide and $SiO_X$ is 100%) are shown in FIG. 2A and FIG. 2B, and Table 1. Further, as Comparative Example 1, the relationships between these in a case where the second electrode 22 is configured from an ITO and an IZO are shown in FIG. 2A and FIG. 2B, and Table 1. Here, the wavelength of incident light X is the wavelength of light that passes through the second electrode 22, and $α_{300}$, $α_{350}$, and $α_{400}$ are absorption characteristics at wavelengths of 300 nm, 350 nm, and 400 nm, respectively. The absorption characteristic of the second electrode 22 (a, unit: %) is expressed by Formula (1) below. In addition, "T" represents the light transmittance (unit: %) of the second electrode 22, and "R" represents the light reflectance (unit: %) of the second electrode 22. The light reflectance (R) is the value measured using an absorption spectrometer.

$$α=100-(T+R) \text{ (\%)} \tag{1}$$

<Table 1> Absorption characteristic α (%)
X (mass %) $α_{300}$ $α_{350}$ $α_{400}$
1 46 16 4.0
2 46 17 4.3
3 44 17 4.3
5 42 19 12
Comparative Example 1 13 3 1.5

It can be seen from FIG. 2B and Table 1 that, by configuring the second electrode 22 from an amorphous oxide made of an ITO-$SiO_X$-based material, the second electrode 22 exhibits a high absorption characteristic in an ultraviolet region around 300 nm. Further, in FIG. 2A and FIG. 2B, the data of X=1 mass %, X=2 mass %, and X=3 mass % almost overlap, and the data of X=5 mass % overlap with the data of X=1 mass %, X=2 mass %, and X=3 mass % in a fairly large portion; thus, it can be seen that the value of the $SiO_X$ concentration "X" at the time of forming the second electrode 22 on the basis of the sputtering method has little influence on the absorption characteristic α. In addition, in FIG. 2A and FIG. 2B, the data of X=5 mass % are shown by "A."

The imaging element etc. of Example 1A including a second electrode 22 made of an ITO-$SiO_X$-based material (provided that X=2 mass %) and the imaging element of Comparative Example 1 including a second electrode 22 made of an ITO were exposed to a high temperature, high humidity environment of 85° C. and 85% RH for 500 hours in a state where a reverse bias voltage of 2.6 volts was applied; and it has been found that, for the dark current in this case on the assumption that the initial dark current value is 100%, the imaging element etc. of Example 1A exhibited no change in dark current, whereas Comparative Example 1 exhibited an increase in dark current of 50%.

The measurement results of the surface roughnesses Ra and Rq and the measurement results of the light transmittance of the second electrodes 22 in the imaging element etc. of Example 1A and the imaging element of Comparative Example 1 are shown in Table 2. Further, the measurement results of the surface roughnesses Ra and Rq of the second electrode 22 in the imaging element etc. of Example 1B including a second electrode 22 made of an ITO-$SiO_X$-based material (provided that X=3 mass %) are shown in Table 2. Further, a surface SEM image of the second electrode (provided that it is a product of annealing treatment at 250° C. for 1 hour in a nitrogen atmosphere) in Example 1A and a surface SEM image of the second electrode (provided that it is a product of annealing treatment at 250° C. for 1 hour in a nitrogen atmosphere) in Comparative Example 1 are shown in FIG. 3A and FIG. 3B, respectively. Thus, since the surface of the second electrode 22 is very smooth, the surface scattering reflection on the second electrode 22 can be suppressed; consequently, the surface reflection of light incident on the second electrode 22 can be reduced, the loss of the amount of light incident on the light receiving layer etc. 23 via the second electrode 22 can be suppressed, and the light current characteristics in photoelectric conversion can be improved still further.

<Table 2>
Example 1A Example 1B Comparative Example 1
Ra 0.3 nm 0.3 nm 0.8 nm
Rq 0.3 nm 0.3 nm 1.0 nm Further, the electric resistance value of the second electrode 22 made of an ITO-SiO$_X$-based material with a thickness of 0.05 μm in Example 1A was $2.0 \times 10^{-4}$ Ω·cm, and the sheet resistance value was 400 Ω/□.

Further, the value of the internal quantum efficiency and the value of the ON/OFF ratio of the imaging element etc. of Example 1A and the imaging element etc. of Comparative Example 1 were as shown in Table 3 below. The internal quantum efficiency η is the ratio of the number of generated electrons to the number of incident photons, and can be expressed by the following formula.

$$\eta = \{(h \cdot c)/(q \cdot \lambda)\}(I/P) = (1.24/\lambda)(I/P)$$

where
h: the Planck constant;
c: the speed of light;
q: the charge of an electron;
λ: the wavelength of incident light (m);
I: light current, which is, in the measurement of Example 1A and Comparative Example 1, the current value (amperes/cm$^2$) obtained by a reverse bias voltage of 1 volt; and
P: the power of incident light (amperes/cm$^2$).

<Table 3>
Internal quantum efficiency (%) ON/OFF ratio
Example 1A 75 3.9
Comparative Example 1 45 1.6

Further, the resulting second electrodes were subjected to an X-ray diffraction test.

Charts showing the X-ray diffraction analysis results of the second electrodes in Example 1 are shown in FIG. 4. In addition, in each chart of FIG. 4, the uppermost stage shows the X-ray diffraction analysis results of X=5 mass %, the second stage shows the X-ray diffraction analysis results of X=3 mass %, the third stage shows the X-ray diffraction analysis results of X=2 mass %, and the lowermost stage shows the X-ray diffraction analysis results of X=1 mass %. Further, the oxygen gas concentration at the time of forming the second electrode by the sputtering method is varied between charts. Further, a chart showing the X-ray diffraction analysis result of the second electrode in Comparative Example 1 is shown in FIG. 5. From FIG. 4, it can be seen that the second electrode of Example 1 is in an amorphous state regardless of the film formation condition (oxygen gas concentration). Then, it can be seen that the amount of oxygen gas introduced (oxygen gas partial pressure) at the time of forming the second electrode 22 on the basis of the sputtering method has little influence on the amorphous state of the second electrode. On the other hand, from FIG. 5, it can be seen that the second electrode of Comparative Example 1 has high crystallinity. In view of FIG. 4, it may be said that at least one of the silicon or the silicon dioxide is present in the second electrode 22 at a mass % that allows the second electrode 22 to maintain an amorphous state regardless of an oxygen gas concentration used to form the second electrode 22. In view of FIG. 4, it may further be said that the second electrode 22 has a peak intensity of 2000 or less in X-ray diffraction.

It has been found that, in the imaging element etc. of Example 1A, the stacked structure body has an internal stress of compressive stress of 10 MPa to 50 MPa. On the other hand, it has been found that, in the imaging element and the electronic device of Comparative Example 1, the stacked structure body has a very high internal stress of compressive stress, i.e. 150 MPa to 180 MPa. In this regard, the first electrode 21, the light receiving layer etc. 23, and the second electrode 22 were formed as films in this order on a silicon wafer to form a stacked structure body, and the internal stress was measured based on a known method using a commercially available thin film stress measuring apparatus. Each sample of the stacked structure body that was formed as a film on a silicon wafer and subjected to stress measurement was immersed in acetone for 30 seconds, and then the condition of the insulating layer was observed using an optical microscope (magnification: 5 times). As a result, in Example 1A, there was no change between before and after immersion; but in Comparative Example 1, peeling was found in a part between the light receiving layer etc. and the second electrode. Thus, it has been found that, by forming the second electrode 22 out of an amorphous oxide, the occurrence of stress damage in the light receiving layer etc. 23 can be suppressed reliably during the formation of the second electrode 22.

Further, a low temperature oxide (LTO, low temperature CVD-SiO$_2$) film with a thickness of 0.1 μm was formed as a film on a silicon semiconductor substrate, and the constituent material of the second electrode (the material in Example 1A) and the material in Comparative Example 1 (an ITO) were formed as a film on the LTO film. Then, the amount of warpage of the stacked structure body composed of the silicon semiconductor substrate, the LTO film, and the constituent material of the second electrode that, while the stacked structure body was allowed to stand in the air, occurred and changed over time due to the LTO film absorbing water in the air via the constituent material of the second electrode was measured. As a result, it has been found that the test sample using the material of Example 1A (an ITO-SiO$_X$-based material) has a smaller amount of warpage than the test sample using the material of Comparative Example 1 (an ITO), and the ITO-SiO$_X$-based material film has higher sealability (lower water permeability) than the ITO film.

Similar results to those described above were obtained also in cases where the second electrode 22 was configured from, in place of an ITO-SiO$_X$-based material, an ITO-Si-based material, an ITO-Si—SiO$_X$-based material, an ITO-Co-based material, an ITO-CoO$_X$-based material, an ITO-Co—CoO$_X$-based material, an ITO-W-based material, an ITO-WO$_X$-based material, an ITO-W—WO$_X$-based material, an ITO-Zn-based material, an ITO-ZnO$_X$-based material, and an ITO-Zn—ZnO$_X$-based material.

In the imaging element etc. of Example 1, since the second electrode is not configured from an ITO but is configured from an amorphous oxide in which the constituent materials are prescribed, the internal stress in the second electrode is reduced; thus, an imaging element, an electronic device, and a solid state imaging device having high reliability in which, in spite of a simple configuration and a simple structure, there is no fear that a characteristic reduction of the imaging element, the electronic device, or the solid state imaging device will be caused can be provided. Further, even if a stress buffer layer having a complicated configuration and a complicated structure is not formed, stress damage is less likely to occur in the light receiving layer etc. during the formation of the second electrode.

Further, since the second electrode is configured from an amorphous oxide, the entry of water can be prevented (or alternatively, reduced), and an imaging element, an electronic device, and a solid state imaging device having high reliability can be provided. Furthermore, the second electrode absorbs ultraviolet light incident on the second electrode, and consequently the arrival of ultraviolet light at the light receiving layer etc. can be suppressed; and since the ultraviolet absorption characteristic of the second electrode is prescribed, the arrival of ultraviolet light incident on the second electrode at the light receiving layer etc. can be suppressed still more reliably. Further, since the thickness of the second electrode is prescribed, light (light other than ultraviolet light) can be caused to reach the light receiving layer etc. via the second electrode still more reliably; furthermore, the second electrode exhibits a function as an electrode reliably. Further, since the second electrode is made of an amorphous oxide having transparency and electrical conductivity, light incident on the second electrode reaches the light receiving layer etc. reliably, and holes or electrons generated in the light receiving layer etc. are reliably sent out to the outside via the second electrode.

Example 2

Example 2 relates to the solid state imaging device of an embodiment of the present disclosure. The solid state imaging device of Example 2 includes a plurality of imaging elements (photoelectric conversion elements) each of which is the imaging element of Example 1.

A conceptual diagram of a solid state imaging device of Example 2 is shown in FIG. 6, and the configuration of the solid state imaging device of Example 2 is shown in FIG. 7. A solid state imaging device (imaging device) 100 of Example 2 is composed of a solid state imaging device 40 and known components of a lens group 101, a digital signal processor (DSP) 102, a frame memory 103, a display device 104, a recording device 105, a manipulation system 106, and a power supply system 107, which components are electrically connected by a bus line 108. The solid state imaging device 40 in Example 2 is composed of an imaging region 41 in which imaging elements 30 described in Example 1 are arranged in a two-dimensional array configuration on a semiconductor substrate (e.g. a silicon semiconductor substrate) and, as peripheral circuits of it, a vertical driving circuit 42, a column signal processing circuit 43, a horizontal driving circuit 44, an output circuit 45, a control circuit 46, etc. These circuits may be formed of known circuits, or may be formed using other circuit configurations (for example, various circuits used in a CCD imaging device or a CMOS imaging device in related art), as a matter of course.

On the basis of a vertical synchronization signal, a horizontal synchronization signal, and a master clock, the control circuit 46 generates a clock signal and a control signal serving as a basis of the operation of the vertical driving circuit 42, the column signal processing circuit 43, and the horizontal driving circuit 44. The generated clock signal and control signal are inputted to the vertical driving circuit 42, the column signal processing circuit 43, and the horizontal driving circuit 44.

The vertical driving circuit 42 is formed of, for example, a shift register, and selectively scans the imaging elements 30 in the imaging region 41 sequentially on a row basis in the vertical direction. A pixel signal based on a current (signal) generated in accordance with the amount of received light in each imaging element 30 is sent to the column signal processing circuit 43 via a vertical signal line 47.

The column signal processing circuit 43 is placed for each column of imaging elements 30, for example, and performs the signal processing of denoising and signal amplification on the signal outputted from the imaging elements 30 of one row for each imaging element, based on a signal from a black reference pixel (not illustrated, formed around the effective pixel area). On the output stage of the column signal processing circuit 43, a horizontal select switch (not illustrated) is provided to be connected to a part leading to a horizontal signal line 48.

The horizontal driving circuit 44 is formed of, for example, a shift register; and sequentially outputs horizontal scanning pulses to sequentially select each of the column signal processing circuits 43, and outputs the signal from each of the column signal processing circuits 43 to the horizontal signal line 48.

The output circuit 45 performs signal processing on the signal sequentially supplied from each of the column signal processing circuits 43 via the horizontal signal line 48, and outputs the resulting signal.

Depending on the material that forms the light receiving layer etc., the light receiving layer etc. itself can be configured to function also as a color filter; therefore, color separation can be made even without providing a color filter. However, depending on the circumstances, a known color filter that transmits a specific wavelength, such as red, green, blue, cyan, magenta, or yellow, may be provided above the light incidence side of the imaging element 30. The solid state imaging device may be configured as a front-side illumination type, or may be configured as a back-side illumination type. As necessary, a shutter for controlling the incidence of light on the imaging element 30 may be provided.

Hereinabove, embodiments of the present disclosure are described based on preferred Examples, but the present disclosure is not limited to these Examples. The structure, configuration, manufacturing conditions, manufacturing method, and used material of the imaging element, the electronic device, and the solid state imaging device described in Examples are only examples, and may be altered as appropriate. In the case where the electronic device of an embodiment of the present disclosure is made to function as a solar cell, the light receiving layer etc. may be irradiated with light in a state where a voltage is not applied between the second electrode and the first electrode. Also a light sensor and an image sensor can be formed by using the electronic device of an embodiment of the present disclosure. The first electrode may be formed of an amorphous oxide made of an indium-tin oxide in which at least one material selected from the group consisting of silicon, a silicon oxide, cobalt, a cobalt oxide, tungsten, a tungsten oxide, zinc, and a zinc oxide is mixed or doped.

Further, the composition of the second electrode included in the imaging element of an embodiment of the present disclosure may be used for various fields in which transparency and electrical conductivity are required. That is, a transparent conductive material made of an amorphous oxide made of an indium-tin oxide in which at least one material selected from the group consisting of silicon, a silicon oxide, cobalt, a cobalt oxide, tungsten, a tungsten oxide, zinc, and a zinc oxide is mixed or doped (for example, an ITO-Si-based material, an ITO-SiO$_X$-based material, an ITO-Si—SiO$_X$-based material, an ITO-Co-based material, an ITO-CoO$_X$-based material, an ITO-Co—CoO$_N$-based material, an ITO-W-based material, an ITO-$WO_X$-based material, an ITO-W—$WO_X$-based material, an ITO-Zn-based material, an ITO-$ZnO_X$-based material, and an ITO-Zn—$ZnO_X$-based material) may be used in various fields. The various prescriptions related to the second electrode in the imaging element of an embodiment of the present disclosure may be used for this transparent conductive material.

Additionally, the present technology may also be configured as below.

(A01) <<Imaging Element: First Embodiment>>
An imaging element including:
a stacked structure body composed of
a first electrode,
a light receiving layer formed on the first electrode, and
a second electrode formed on the light receiving layer,
and configured such that light is incident from the second electrode,
in which the second electrode is made of an amorphous oxide made of an indium-tin oxide in which at least one material selected from the group consisting of silicon and a silicon oxide is mixed or doped.

(A02)
The imaging element according to (A01), in which the second electrode has absorption characteristics of 20% or more at a wavelength of 300 nm and 15% or more at a wavelength of 350 nm.

(A03)
The imaging element according to (A01) or (A02), in which a thickness of the second electrode is $1\times10^{-8}$ m to $1.5\times10^{-7}$ m.

(A04)
The imaging element according to any one of (A01) to (A03), in which the material is mixed or doped at 5 mass % or less in the second electrode.

(A05)
The imaging element according to (A04), in which the material is mixed or doped at 1 mass % or more and 3 mass % or less in the second electrode.

(A06)
The imaging element according to any one of (A01) to (A05), in which a surface roughness Ra of the second electrode is 0.5 nm or less, and a surface roughness Rq of the second electrode is 0.5 nm or less.

(A07)
The imaging element according to any one of (A01) to (A06), in which a light transmittance of the second electrode for light of wavelengths of 400 nm to 660 nm is 65% or more.

(A08)
The imaging element according to any one of (A01) to (A07), in which an electric resistance value of the second electrode is $1\times10^6$ Ω·cm or less.

(A09)
The imaging element according to any one of (A01) to (A07), in which a sheet resistance value of the second electrode is $3\times10$Ω/□ to $1\times10^3$Ω/□.

(A10)
The imaging element according to any one of (A01) to (A09), in which the stacked structure body has an internal stress of compressive stress of 10 MPa to 50 MPa.

(A11)
The imaging element according to any one of (A01) to (A10), in which the first electrode is made of an amorphous oxide made of an indium-tin oxide in which at least one material selected from the group consisting of silicon, a silicon oxide, cobalt, a cobalt oxide, tungsten, a tungsten oxide, zinc, and a zinc oxide is mixed or doped.

(B01) <<Imaging Element: Second Embodiment>>
An imaging element including:
a stacked structure body composed of
a first electrode,
a light receiving layer formed on the first electrode, and
a second electrode formed on the light receiving layer,
and configured such that light is incident from the second electrode,
in which the second electrode is made of an amorphous oxide made of an indium-tin oxide in which at least one material selected from the group consisting of cobalt, a cobalt oxide, tungsten, a tungsten oxide, zinc, and a zinc oxide is mixed or doped.

(B02)
The imaging element according to (B01), in which the second electrode has absorption characteristics of 20% or more at a wavelength of 300 nm and 15% or more at a wavelength of 350 nm.

(B03)
The imaging element according to (B01) or (B02), in which a thickness of the second electrode is $1\times10^{-8}$ m to $1.5\times10^{-7}$ m.

(B04)
The imaging element according to any one of (B01) to (B03), in which the material is mixed or doped at 5 mass % or less in the second electrode.

(B05)
The imaging element according to (B04), in which the material is mixed or doped at 1 mass % or more and 3 mass % or less in the second electrode.

(B06)
The imaging element according to any one of (B01) to (B05), in which a surface roughness Ra of the second electrode is 0.5 nm or less, and a surface roughness Rq of the second electrode is 0.5 nm or less.

(B07)
The imaging element according to any one of (B01) to (B06), in which a light transmittance of the second electrode for light of wavelengths of 400 nm to 660 nm is 65% or more.

(B08)
The imaging element according to any one of (B01) to (B07), in which an electric resistance value of the second electrode is $1\times10^6$ Ω·cm or less.

(B09)
The imaging element according to any one of (B01) to (B07), in which a sheet resistance value of the second electrode is $3\times10$Ω/□ to $1\times10^3$Ω/□.

(B10)
The imaging element according to any one of (B01) to (B09), in which the stacked structure body has an internal stress of compressive stress of 10 MPa to 50 MPa.

(B11)
The imaging element according to any one of (B01) to (B10), in which the first electrode is made of an amorphous oxide made of an indium-tin oxide in which at least one material selected from the group consisting of silicon, a silicon oxide, cobalt, a cobalt oxide, tungsten, a tungsten oxide, zinc, and a zinc oxide is mixed or doped.

(C01) <<Solid State Imaging Device: First Embodiment>>

A solid state imaging device including a plurality of imaging elements, in which each of the imaging elements includes
a stacked structure body composed of
a first electrode,
a light receiving layer formed on the first electrode, and
a second electrode formed on the light receiving layer,
and configured such that light is incident from the second electrode, and
the second electrode is made of an amorphous oxide made of an indium-tin oxide in which at least one material selected from the group consisting of silicon and a silicon oxide is mixed or doped.

(C02)

A solid state imaging device including a plurality of imaging elements each of which is the imaging element according to any one of (A01) to (A11).

(C03) <<Solid State Imaging Device: Second Embodiment>>

A solid state imaging device including a plurality of imaging elements,
in which each of the imaging elements includes
a stacked structure body composed of
a first electrode,
a light receiving layer formed on the first electrode, and
a second electrode formed on the light receiving layer,
and configured such that light is incident from the second electrode, and
the second electrode is made of an amorphous oxide made of an indium-tin oxide in which at least one material selected from the group consisting of cobalt, a cobalt oxide, tungsten, a tungsten oxide, zinc, and a zinc oxide is mixed or doped.

(C04) A solid state imaging device including a plurality of imaging elements each of which is the imaging element according to any one of (B01) to (B11).

(D01) <<Electronic Device: First Embodiment>>

An electronic device including:
a stacked structure body composed of
a first electrode,
a light emitting/light receiving layer formed on the first electrode, and
a second electrode formed on the light emitting/light receiving layer,
and configured such that light is incident from the second electrode,
in which the second electrode is made of an amorphous oxide made of an indium-tin oxide in which at least one material selected from the group consisting of silicon and a silicon oxide is mixed or doped.

(D02)

The electronic device according to (D01), in which the second electrode has absorption characteristics of 20% or more at a wavelength of 300 nm and 15% or more at a wavelength of 350 nm.

(D03)

The electronic device according to (D01) or (D02), in which a thickness of the second electrode is $1\times10^{-8}$ m to $1.5\times10^{-7}$ m.

(D04)

The electronic device according to any one of (D01) to (D03), in which the material is mixed or doped at 5 mass % or less in the second electrode.

(D05)

The electronic device according to (D04), in which the material is mixed or doped at 1 mass % or more and 3 mass % or less in the second electrode.

(D06)

The electronic device according to any one of (D01) to (D05), in which a surface roughness Ra of the second electrode is 0.5 nm or less, and a surface roughness Rq of the second electrode is 0.5 nm or less.

(D07)

The electronic device according to any one of (D01) to (D06), in which a light transmittance of the second electrode for light of wavelengths of 400 nm to 660 nm is 65% or more.

(D08)

The electronic device according to any one of (D01) to (D07), in which an electric resistance value of the second electrode is $1\times10^{-6}$ $\Omega\cdot$cm or less.

(D09)

The electronic device according to any one of (D01) to (D07), in which a sheet resistance value of the second electrode is $3\times10\Omega/\square$ to $1\times10^3\Omega/\square$.

(D10)

The electronic device according to any one of (D01) to (D09), in which the stacked structure body has an internal stress of compressive stress of 10 MPa to 50 MPa.

(D11)

The electronic device according to any one of (D01) to (D10), in which the first electrode is made of an amorphous oxide made of an indium-tin oxide in which at least one material selected from the group consisting of silicon, a silicon oxide, cobalt, a cobalt oxide, tungsten, a tungsten oxide, zinc, and a zinc oxide is mixed or doped.

(E01) <<Electronic Device: Second Embodiment>>

An electronic device including:
a stacked structure body composed of
a first electrode,
a light emitting/light receiving layer formed on the first electrode, and
a second electrode formed on the light emitting/light receiving layer,
and configured such that light is incident from the second electrode,
in which the second electrode is made of an amorphous oxide made of an indium-tin oxide in which at least one material selected from the group consisting of cobalt, a cobalt oxide, tungsten, a tungsten oxide, zinc, and a zinc oxide is mixed or doped.

(E02)

The electronic device according to (E01), in which the second electrode has absorption characteristics of 20% or more at a wavelength of 300 nm and 15% or more at a wavelength of 350 nm.

(E03)

The electronic device according to (E01) or (E02), in which a thickness of the second electrode is $1\times10^{-8}$ m to $1.5\times10^{-7}$ m.

(E04)

The electronic device according to any one of (E01) to (E03), in which the material is mixed or doped at 5 mass % or less in the second electrode.

(E05)

The electronic device according to (E04), in which the material is mixed or doped at 1 mass % or more and 3 mass % or less in the second electrode.

(E06)
The electronic device according to any one of (E01) to (E05), in which a surface roughness Ra of the second electrode is 0.5 nm or less, and a surface roughness Rq of the second electrode is 0.5 nm or less.
(E07)
The electronic device according to any one of (E01) to (E06), in which a light transmittance of the second electrode for light of wavelengths of 400 nm to 660 nm is 65% or more.
(E08)
The electronic device according to any one of (E01) to (E07), in which an electric resistance value of the second electrode is $1\times10^{-6}$ Ω·cm or less.
(E09)
The electronic device according to any one of (E01) to (E07), in which a sheet resistance value of the second electrode is $3\times10$ Ω/□ to $1\times10^3$ Ω/□.
(E10)
The electronic device according to any one of (E01) to (E09), in which the stacked structure body has an internal stress of compressive stress of 10 MPa to 50 MPa.
(E11)
The electronic device according to any one of (E01) to (E10), in which the first electrode is made of an amorphous oxide made of an indium-tin oxide in which at least one material selected from the group consisting of silicon, a silicon oxide, cobalt, a cobalt oxide, tungsten, a tungsten oxide, zinc, and a zinc oxide is mixed or doped.

(1)
An imaging element, comprising:
a first electrode;
a second electrode; and
a light receiving layer between the first electrode and the second electrode to receive incident light from the second electrode,
wherein the second electrode includes an indium-tin oxide layer which includes at least one of silicon or silicon oxide.
(2)
The imaging element of (1), wherein the second electrode is amorphous.
(3)
The imaging element according to (1), wherein the second electrode has absorption characteristics of 20% or more at a wavelength of 300 nm.
(4)
The imaging element according to (1), wherein a thickness of the second electrode is $1\times10^{-8}$ m to $1.5\times10^{-7}$ m.
(5)
The imaging element according to (1), wherein the at least one of the silicon or the silicon dioxide is mixed or doped at 5 mass % or less in the second electrode.
(6)
The imaging element according to (1), wherein the at least one of the silicon or the silicon dioxide is mixed or doped at 1 mass % or more and 3 mass % or less in the second electrode.
(7)
The imaging element according to (1), wherein a surface roughness Ra of the second electrode is 0.5 nm or less, and a surface roughness Rq of the second electrode is 0.5 nm or less.

(8)
The imaging element according to (1), wherein a light transmittance of the second electrode for light of wavelengths of 400 nm to 660 nm is 65% or more.
(9)
The imaging element according to (1), wherein an electric resistance value of the second electrode is $1\times10^6$ Ω·cm or less.
(10)
The imaging element according to (1), wherein the first electrode includes an indium-tin oxide layer which includes at least one of silicon, silicon oxide, cobalt, cobalt oxide, tungsten, tungsten oxide, zinc, or zinc oxide.
(11)
The imaging element according to (10), wherein the first electrode is amorphous.
(12)
The imaging element according to (10), wherein the at least one of the silicon, the silicon oxide, the cobalt, the cobalt oxide, the tungsten, the tungsten oxide, the zinc, or the zinc oxide is mixed or doped in the first electrode.
(13)
The imaging element according to (1), wherein the second electrode has absorption characteristics of 15% or more at a wavelength of 350 nm.
(14)
The imaging element according to (1), wherein the second electrode has a peak intensity of 2000 or less in X-ray diffraction.
(15)
A solid state imaging device, comprising:
a plurality of imaging elements each having a structure of the imaging element according to (1).
(16)
An imaging element, comprising:
a first electrode;
a second electrode; and
a light receiving layer between the first electrode and the second electrode to receive incident light from the second electrode,
wherein the second electrode includes an indium-tin oxide layer which includes at least one of cobalt, cobalt oxide, tungsten, tungsten oxide, zinc, or zinc oxide.
(17)
The imaging element according to (16), wherein the second electrode is amorphous.
(18)
The imaging element according to (16), wherein the at least one of the cobalt, the cobalt oxide, the tungsten, the tungsten oxide, the zinc, or the zinc oxide is mixed or doped at 5 mass % or less in the second electrode.
(19)
A solid state imaging device, comprising:
a plurality of imaging elements each having a structure of the imaging element according to (16).
(20)
An electronic device, comprising:
a first electrode;
a second electrode; and
a light emitting or receiving layer between the first electrode and the second electrode to transmit light received from the second electrode,
wherein the second electrode includes an indium-tin oxide layer which includes i) at least one of silicon or silicon oxide, or ii) at least one of cobalt, cobalt oxide, tungsten, tungsten oxide, zinc, or zinc oxide.

REFERENCE SIGNS LIST

- 10 substrate
- 11 interconnection
- 12 insulating layer
- 13 opening
- 21 first electrode
- 22 second electrode
- 23 light receiving layer or light emitting/light receiving layer (light receiving layer etc.)
- 30 imaging element
- 40 solid state imaging device
- 41 imaging region
- 42 vertical driving circuit
- 43 column signal processing circuit
- 44 horizontal driving circuit
- 45 output circuit
- 46 control circuit
- 47 vertical signal line
- 48 horizontal signal line
- 101 lens group
- 102 digital signal processor (DSP)
- 103 frame memory
- 104 display device
- 105 recording device
- 106 manipulation system
- 107 power supply system
- 108 bus line

The invention claimed is:

1. An imaging element, comprising:
a first electrode;
a second electrode; and
a light receiving layer between the first electrode and the second electrode to receive incident light from the second electrode,
wherein the second electrode includes an indium-tin oxide layer which includes at least one of silicon or silicon oxide, and
wherein the second electrode has an absorption characteristic of 20% or more at a wavelength of 300 nm, where the absorption characteristic is found by 100−(T+R) %, where T is a percentage of light transmittance of the second electrode at the wavelength of 300 nm and R is a percentage of light reflectance of the second electrode at the wavelength of 300 nm.

2. The imaging element of claim 1, wherein the quantum efficiency of the light receiving layer is about 75% at a given wavelength of light received through the second electrode.

3. The imaging element according to claim 1, wherein a stacked structure including the first electrode, the second electrode, and the light receiving layer has an internal compressive stress of 10 MPa to 50 MPa.

4. The imaging element according to claim 1, wherein a thickness of the second electrode is $1\times10^{-8}$ m to $1.5\times10^{-7}$ m, and wherein the indium-tin oxide layer includes the silicon or the silicon oxide at a mass % that allows the second electrode to maintain an amorphous state regardless of an oxygen gas concentration used to form the second electrode.

5. The imaging element according to claim 1, wherein the at least one of the silicon or the silicon oxide is mixed or doped at 5 mass % or less in the second electrode.

6. The imaging element according to claim 1, wherein the at least one of the silicon or the silicon oxide is mixed or doped at 1 mass % or more and 3 mass % or less in the second electrode.

7. The imaging element according to claim 1, wherein a surface roughness Ra of the second electrode is 0.5 nm or less, and a surface roughness Rq of the second electrode is 0.5 nm or less.

8. The imaging element according to claim 1, wherein a light transmittance of the second electrode for light of wavelengths of 400 nm to 660 nm is 65% or more.

9. The imaging element according to claim 1, wherein an electric resistance value of the second electrode is $1\times10^{6}$ Ω·cm or less.

10. The imaging element according to claim 1, wherein the first electrode includes an indium-tin oxide layer which includes at least one of silicon, silicon oxide, cobalt, cobalt oxide, tungsten, tungsten oxide, zinc, or zinc oxide.

11. The imaging element according to claim 10, wherein the first electrode is amorphous.

12. The imaging element according to claim 10, wherein the at least one of the silicon, the silicon oxide, the cobalt, the cobalt oxide, the tungsten, the tungsten oxide, the zinc, or the zinc oxide is mixed or doped in the first electrode.

13. The imaging element according to claim 1, wherein the second electrode has absorption characteristics of 15% or more at a wavelength of 350 nm.

14. The imaging element according to claim 1, wherein the second electrode has a peak intensity of 2000 or less in X-ray diffraction.

15. A solid state imaging device, comprising:
a plurality of imaging elements each having a structure of the imaging element according to claim 1.

16. An imaging element, comprising:
a first electrode;
a second electrode; and
a light receiving layer between the first electrode and the second electrode to receive incident light from the second electrode,
wherein the second electrode includes an indium-tin oxide layer which includes at least one of cobalt, cobalt oxide, tungsten, tungsten oxide, zinc, or zinc oxide, and
wherein the second electrode has an absorption characteristic of 20% or more at a wavelength of 300 nm, where the absorption characteristic is found by 100−(T+R) %, where T is a percentage of light transmittance of the second electrode and R is a percentage of light reflectance of the second electrode.

17. The imaging element according to claim 16, wherein the second electrode is amorphous.

18. The imaging element according to claim 16, wherein the at least one of the cobalt, the cobalt oxide, the tungsten, the tungsten oxide, the zinc, or the zinc oxide is mixed or doped at 5 mass % or less in the second electrode.

19. A solid state imaging device, comprising:
a plurality of imaging elements each having a structure of the imaging element according to claim 16.

20. An electronic device, comprising:
a first electrode;
a second electrode; and
a light emitting or receiving layer between the first electrode and the second electrode to transmit light received from the second electrode,
wherein the second electrode includes an indium-tin oxide layer which includes i) at least one of silicon or silicon oxide; or ii) at least one of cobalt, cobalt oxide, tungsten, tungsten oxide, zinc, or zinc oxide, and wherein the second electrode has an absorption characteristic of 20% or more at a wavelength of 300 nm, where the absorption characteristic is found by 100−(T+R) %, where T is a percentage of light transmittance of the second electrode and R is a percentage of light reflectance of the second electrode.

\* \* \* \* \*